United States Patent
Shiokawa et al.

(10) Patent No.: US 11,276,447 B2
(45) Date of Patent: Mar. 15, 2022

(54) SPIN CURRENT MAGNETORESISTANCE EFFECT ELEMENT AND MAGNETIC MEMORY

(71) Applicant: TDK CORPORATION, Tokyo (JP)

(72) Inventors: Yohei Shiokawa, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/333,176

(22) PCT Filed: Jul. 24, 2018

(86) PCT No.: PCT/JP2018/027646
§ 371 (c)(1),
(2) Date: Mar. 13, 2019

(87) PCT Pub. No.: WO2019/031226
PCT Pub. Date: Feb. 14, 2019

(65) Prior Publication Data
US 2019/0244651 A1    Aug. 8, 2019

(30) Foreign Application Priority Data
Aug. 7, 2017   (JP) .............................. JP2017-152468

(51) Int. Cl.
*G11C 11/16* (2006.01)
*H01L 27/22* (2006.01)
(Continued)

(52) U.S. Cl.
CPC .......... *G11C 11/1673* (2013.01); *G11C 11/16* (2013.01); *G11C 11/161* (2013.01);
(Continued)

(58) Field of Classification Search
CPC ... G11C 11/161; G11C 11/16; G11C 11/1673; G11C 11/1675; G11C 11/18; H01L 27/228; H01L 43/04; H01L 43/06; H01L 43/10
See application file for complete search history.

(56) References Cited

U.S. PATENT DOCUMENTS

| 8,350,347 B2 | 1/2013 | Gaudin et al. |
| 8,889,433 B2 | 11/2014 | De Brosse et al. |

(Continued)

FOREIGN PATENT DOCUMENTS

| EP | 3348929 A1 | 7/2018 |
| JP | 2017-053567 A | 3/2017 |

(Continued)

OTHER PUBLICATIONS

Miron et al., "Perpendicular switching of a single ferromagnetic layer induced by in-plane current injection," Nature, Aug. 11, 2011, vol. 476, pp. 189-194.

(Continued)

*Primary Examiner* — Vanthu T Nguyen
(74) *Attorney, Agent, or Firm* — Oliff PLC (57) ABSTRACT

A spin current magnetoresistance effect element includes a magnetoresistance effect element, a spin-orbit torque wiring that extends in a first direction intersecting a lamination direction of the magnetoresistance effect element and is positioned on a side of the magnetoresistance effect element with the second ferromagnetic metal layer, and a control unit configured to control a direction of a current during reading. The control unit is connected to at least one of a first and second point, which are positions with the magnetoresistance effect element interposed therebetween in the first direction in the spin-orbit torque wiring, and a third point on a side of the magnetoresistance effect element with the first ferromagnetic layer. The control unit shunts a read current (Continued)

during reading from the third point toward the first point and the second point or merges the read current toward the third point from the first point and the second point.

7 Claims, 7 Drawing Sheets

(51) Int. Cl.
    *H01L 43/02*     (2006.01)
    *H01F 10/32*     (2006.01)
    *H01L 27/105*     (2006.01)
    *H01L 43/08*     (2006.01)
    *H01L 29/82*     (2006.01)
    *H01L 21/8239*     (2006.01)
    *H01L 43/10*     (2006.01)
    *H01L 43/06*     (2006.01)

(52) U.S. Cl.
    CPC ....... *H01F 10/329* (2013.01); *H01F 10/3254* (2013.01); *H01L 21/8239* (2013.01); *H01L 27/105* (2013.01); *H01L 27/228* (2013.01); *H01L 29/82* (2013.01); *H01L 43/02* (2013.01); *H01L 43/08* (2013.01); *G11C 11/1675* (2013.01); *H01F 10/325* (2013.01); *H01F 10/3286* (2013.01); *H01L 43/06* (2013.01); *H01L 43/10* (2013.01)

(56) References Cited

U.S. PATENT DOCUMENTS

| | | | |
|---|---|---|---|
| 9,076,537 B2* | 7/2015 | Khvalkovskiy | ....... H01L 27/228 |
| 9,230,626 B2* | 1/2016 | Buhrman | ................ G11C 11/18 |
| 9,647,033 B2* | 5/2017 | Shin | ....................... H01L 27/228 |
| 9,881,660 B2* | 1/2018 | Yoda | .................... G11C 11/1675 |
| 10,008,248 B2* | 6/2018 | Buhrman | ................ H01L 43/08 |
| 10,229,722 B2* | 3/2019 | DeBrosse | ............. H01L 43/065 |
| 2015/0348606 A1 | 12/2015 | Buhrman et al. | |
| 2016/0267961 A1 | 9/2016 | Lee et al. | |
| 2017/0169872 A1 | 6/2017 | Yoda et al. | |
| 2017/0222135 A1 | 8/2017 | Fukami et al. | |
| 2018/0061467 A1 | 3/2018 | Kan et al. | |
| 2018/0158499 A1 | 6/2018 | Shimomura et al. | |
| 2018/0268886 A1 | 9/2018 | Ishikawa et al. | |

FOREIGN PATENT DOCUMENTS

| | | |
|---|---|---|
| JP | 2017-112351 A | 6/2017 |
| JP | 6290487 B1 | 3/2018 |
| JP | 2018-093065 A | 6/2018 |
| WO | 2016/021468 A1 | 2/2016 |
| WO | 2016/159017 A1 | 10/2016 |

OTHER PUBLICATIONS

Kato et al., "Observation of the Spin Hall Effect in Semiconductors," Science, Dec. 10, 2004, vol. 306, pp. 1910-1913.
Liu et al., "Spin torque switching with the giant spin Hall effect of tantalum," Science, 2012, vol. 336, pp. 1-19, and vol. 555, pp. 1-12.
Liu et al., "Current-Induced Switching of Perpendicularly Magnetized Magnetic Layers Using Spin Torque from the Spin Hall Effect," Physical Review Letters, Aug. 2012, vol. 109, 096602-1-096602-5.
Lee et al., "Threshold current for switching of a perpendicular magnetic layer induced by spin Hall effect," Applied Physics Letters, 2013, vol. 102, 112410-1-112410-5.
Lee et al., "Thermally activated switching of perpendicular magnet by spin-orbit spin torque," Applied Physics Letters, 2014, vol. 104, 072413-1-072413-5.
Fukami et al., "Magnetization switching by spin-orbit torque in an antiferromagnet-ferromagnet bilyaer system," Nature Materials, May 2016, vol. 15, pp. 535-542.
Fukami et al., "A spin-orbit torque switching scheme with collinear magnetic easy axis and current configuration," Nature Nanotechnology, 2016, pp. 1-6.
Takahashi et al., "Spin injection and detection in magnetic nanostructures," Physical Review B, 2003, vol. 67, 352409-1-052409-4.
Seo et al., "Area-Efficient SOT-MRAM With a Schottky Diode," IEEE Electron Device Letters, Aug. 2016, vol. 37, No. 8, pp. 982-985.
Zhang et al., "Spin Hall Effects in Metallic Antiferromagnets," Physical Review Letters, Nov. 7, 2014, vol. 113, pp. 196602-1-196602-6.
Oct. 2, 2018 International Search Report issued in International Patent Application No. PCT/JP2018/027646.

* cited by examiner

SPIN CURRENT MAGNETORESISTANCE EFFECT ELEMENT AND MAGNETIC MEMORY

TECHNICAL FIELD

The present invention relates to a spin current magnetoresistance effect element and a magnetic memory.

Priority is claimed on Japanese Patent Application No. 2017-152468, filed Aug. 7, 2017, the content of which is incorporated herein by reference.

BACKGROUND ART

A giant magnetoresistance (GMR) element made of a multi-layer film including a ferromagnetic layer and a nonmagnetic layer and a tunneling magnetoresistance (TMR) element using an insulating layer (tunnel barrier layer, barrier layer) as a nonmagnetic layer are known. In general, a TMR element has a higher element resistance than a GMR element, but a magnetoresistance (MR) ratio of a TMR element is higher than an MR ratio of a GMR element. Therefore, as an element for a magnetic sensor, a high-frequency component, a magnetic head, and a nonvolatile random access memory (MRAM), a TMR element is being focused upon.

An MRAM reads and writes data using a characteristic in which an element resistance of a TMR element changes when directions of magnetizations of two ferromagnetic layers with an insulating layer therebetween change. As a writing method of an MRAM, a method in which writing (magnetization reversal) is performed using a magnetic field generated from a current and a method in which writing (magnetization reversal) is performed using a spin transfer torque (STT) generated when a current flows in a lamination direction of a magnetoresistance effect element are known.

While magnetization reversal of a TMR element using an STT is efficient in consideration of the efficiency of energy, an inversion current density for magnetization reversal is high. In order to prolong the lifespan of the TMR element, it is desirable that the inversion current density be low. This similarly applies to a GMR element.

In addition, in recent years, as a method of reducing an inversion current, magnetization reversal using a pure spin current generated by a spin-orbit interaction has been focused upon (for example, Non Patent Literature 1). Although this mechanism has not yet been sufficiently clarified, it is thought that a pure spin current generated by a spin-orbit interaction or the Rashba effect at an interface between different types of material induces a spin-orbit torque (SOT) and magnetization reversal occurs. A pure spin current is generated when the same numbers of upward spin electrons and downward spin electrons flow in directions opposite to each other, and flows of electric charges cancel out. Therefore, a current flowing through the magnetoresistance effect element is zero and a prolonged lifespan for the magnetoresistance effect element is expected.

In addition, Patent Literature 1 describes an element including a magnetoresistance effect element, a wiring that is connected to the magnetoresistance effect element and makes a spin Hall effect, and a transistor that is disposed at a position different from that of the magnetoresistance effect element in a plan view. In Patent Literature 1, it is described that, when a current during writing flows in a lamination direction of the magnetoresistance effect element and an extending direction of a wiring, magnetization reversal according to STT is assisted by the SOT.

CITATION LIST

Patent Literature

[Patent Literature 1]
U.S. Pat. No. 8,889,433 Specification

Non Patent Literature

[Non Patent Literature 1]
1. M. Miron, K. Garello, G. Gaudin, P.-J. Zermatten, M. V. Costache, S. Auffret, S. Bandiera, B. Rodmacq, A. Schuhl, and P. Gambardella, Nature, 476, 189(2011).

SUMMARY OF INVENTION

Technical Problem

In order to use a magnetoresistance effect element as an information recording unit, it is necessary not only to appropriately write data but also to appropriately read data. However, although data writing methods are being studied, study on control when data is read cannot be said to be sufficient.

The present invention has been made in order to solve the above problem, and an object of the present invention is to provide a spin current magnetoresistance effect element in which erroneous writing during reading is reduced.

Solution to Problem

The inventors conducted study on a read current flow. As a result of the study, a problem that, in a spin current magnetoresistance effect element having a spin-orbit torque wiring that induces an SOT, a part of a read current flows along the spin-orbit torque wiring was found. A current flow along the spin-orbit torque wiring during reading induces an SOT and causes erroneous writing.

In addition, as a result of extensive studies, the inventors found that it is possible to reduce erroneous writing during reading by controlling a current flowing through a spin-orbit torque wiring during reading.

That is, in order to solve the problems, the present invention provides the following aspects.

(1) A spin current magnetoresistance effect element according to a first aspect includes:
a magnetoresistance effect element including a first ferromagnetic metal layer, a second ferromagnetic metal layer, and a nonmagnetic layer interposed between the first ferromagnetic metal layer and the second ferromagnetic metal layer;
a spin-orbit torque wiring that extends in a first direction intersecting a lamination direction of the magnetoresistance effect element and is positioned on a side of the magnetoresistance effect element with the second ferromagnetic metal layer; and
a control unit configured to control a direction of a current that flows through the magnetoresistance effect element and the spin-orbit torque wiring during reading,
wherein the control unit is connected to at least one of a first point and a second point, which are positions with the magnetoresistance effect element interposed therebetween in the first direction in the spin-orbit torque wiring, and a third point on a side of the magnetoresistance effect element with the first ferromagnetic layer, and wherein the control unit is configure to shunt a read current during reading from the third point toward the first point and the second point or merges the read current toward the third point from the first point and the second point.

(2) In the spin current magnetoresistance effect element according to the first aspect, the control unit may set potentials of the first point and the second point during reading to be higher or lower than a potential of the third point.

(3) The spin current magnetoresistance effect element according to the first aspect may further include a second transistor that is connected to the first point and a third transistor that is connected to the second point.

(4) In the spin-orbit torque wiring of the spin current magnetoresistance effect element according to the first aspect, a resistance value between the magnetoresistance effect element and the first point may be the same as a resistance value between the magnetoresistance effect element and the second point.

(5) In the spin current magnetoresistance effect element according to the first aspect, the first point and the second point may be provided at positions symmetrical with respect to the magnetoresistance effect element in a plan view.

(6) In the spin current magnetoresistance effect element according to the first aspect, a cross-sectional area of the spin-orbit torque wiring cut in a plane orthogonal to the first direction may be smaller than a cross-sectional area of the magnetoresistance effect element cut in a plane orthogonal to the lamination direction.

(7) In the spin current magnetoresistance effect element according to the first aspect, an area of a first surface of the second ferromagnetic metal layer on the side with the spin-orbit torque wiring may be larger than an area of a second surface of the second ferromagnetic metal layer on the side of the nonmagnetic layer.

(8) The spin current magnetoresistance effect element according to the first aspect may further include a rectifier that is electrically connected to the first ferromagnetic metal layer.

(9) A magnetic memory according to a second aspect includes a plurality of spin current magnetoresistance effect elements according to the first aspect.

Advantageous Effects of Invention

According to the spin current magnetoresistance effect element and the magnetic memory according to the above aspects, it is possible to reduce erroneous writing during reading.

DESCRIPTION OF EMBODIMENTS

The present embodiment will be appropriately described below in detail with reference to the drawings. In the drawings used in the following description, in order to facilitate understanding of features, feature parts are enlarged for convenience of illustration in some cases, and dimensional proportions and the like of components may be different from those of actual components. Materials, sizes, and the like exemplified in the following description are examples, the present invention is not limited thereto, and they can be appropriately changed within a range in which effects of the present invention are obtained.

(Spin Current Magnetoresistance Effect Element)

Figure 1:
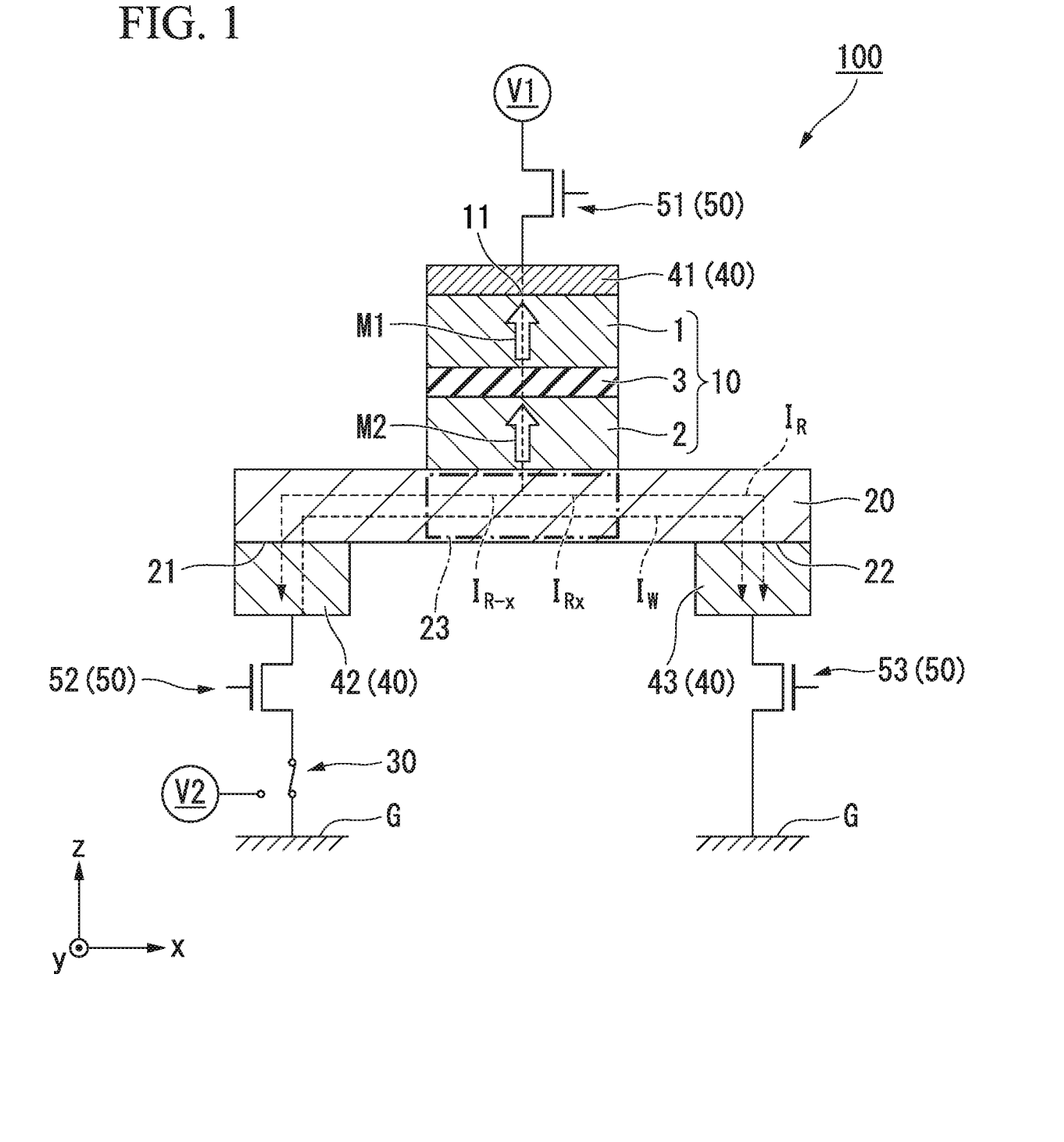
FIG. 1 is a cross-sectional view schematically showing a spin current magnetoresistance effect element according to a first embodiment.

FIG. 1 is a cross-sectional view schematically showing a spin current magnetoresistance effect element according to a first embodiment. A spin current magnetoresistance effect element 100 according to the first embodiment includes a magnetoresistance effect element 10, a spin-orbit torque wiring 20, and a control unit 30. In addition, the spin current magnetoresistance effect element 100 shown in FIG. 1 includes an electrode 40 for assisting electrical connection and an element selection unit 50 configured to determine whether a current is flowing in an element.

Hereinafter, a lamination direction of the magnetoresistance effect element 10 will be defined as a z direction, a first direction in which the spin-orbit torque wiring 20 extends will be defined as an x direction, and a second direction orthogonal to both the z direction and the x direction will be defined as a y direction.

<Magnetoresistance Effect Element>

The magnetoresistance effect element 10 includes a first ferromagnetic metal layer 1, a second ferromagnetic metal layer 2 in which a magnetization direction changes, and a nonmagnetic layer 3 interposed between the first ferromagnetic metal layer 1 and the second ferromagnetic metal layer 2. A magnetization M1 of the first ferromagnetic metal layer 1 is fixed relative to a magnetization M2 of the second ferromagnetic metal layer 2.

The magnetoresistance effect element 10 functions when directions of the magnetization M1 of the first ferromagnetic metal layer 1 and the magnetization M2 of the second ferromagnetic metal layer 2 change relative to each other. In application to a coercivity-differing type (pseudo spin valve type) MRAM, the coercivity of the first ferromagnetic metal layer 1 of the magnetoresistance effect element 10 is set to be larger than the coercivity of the second ferromagnetic metal layer 2. In application to an exchange bias type (spin valve; spin valve type) MRAM, the magnetization M1 of the first ferromagnetic metal layer 1 in the magnetoresistance effect element 10 is fixed by exchange coupling with an antiferromagnetic layer.

The magnetoresistance effect element 10 is a tunneling magnetoresistance (TMR) element when the nonmagnetic layer 3 is made of an insulator and is a giant magnetoresistance (GMR) element when the nonmagnetic layer 3 is made of a metal.

As a layered structure of the magnetoresistance effect element, a layered structure of a known magnetoresistance effect element can be used. For example, each layer may be composed of a plurality of layers, and may include another layer such as an antiferromagnetic layer for fixing a magnetization direction of the first ferromagnetic metal layer 1. The first ferromagnetic metal layer 1 is also called a fixed layer or a reference layer, and the second ferromagnetic metal layer 2 is also called a free layer or a storage layer.

A known material can be used as a material of the first ferromagnetic metal layer 1. For example, a metal selected from the group consisting of Cr, Mn, Co, Fe and Ni and an alloy that contains at least one of these metals and exhibits ferromagnetism can be used. In addition, an alloy containing these metals and at least one element from B, C, and N can be used. Specifically, Co—Fe and Co—Fe—B may be exemplified.

In addition, a Heusler alloy such as $Co_2FeSi$ can be used as a material of the first ferromagnetic metal layer 1. A Heusler alloy has high spin polarization can increase the MR ratio of the magnetoresistance effect element 10. A Heusler alloy contains an intermetallic compound having a chemical composition of XYZ or $X_2YZ$, where X is a transition metal element from the Co, Fe, Ni, or Cu groups or a noble metal element in the periodic table, Y is a transition metal from the Mn, V, Cr or Ti groups or the same elements as for X, and Z is a typical element of Groups III to Group V. For example, $Co_2FeSi$, $Co_2MnSi$ and $Co_2Mn_{1-a}Fe_aAl_bSi_{1-b}$ may be exemplified.

In addition, in order to further increase the coercivity of the first ferromagnetic metal layer 1 with respect to the second ferromagnetic metal layer 2, an antiferromagnetic material such as IrMn and PtMn may be used as a material in contact with the first ferromagnetic metal layer 1. In addition, a synthetic ferromagnetic coupling structure may be used in order to prevent a leakage magnetic field of the first ferromagnetic metal layer 1 from influencing the second ferromagnetic metal layer 2.

In addition, when a magnetization direction of the first ferromagnetic metal layer 1 is perpendicular to a lamination surface, a lamination film of Co and Pt is preferably used. Specifically, the first ferromagnetic metal layer 1 can have FeB(1.0 nm)/Ta(0.2 nm)/[Pt(0.16 nm)/Co(0.16 nm)]$_4$/Ru (0.9 nm)/[Co(0.24 nm)/Pt(0.16 nm)]$_6$ in order from the side of the nonmagnetic layer 3.

As a material of the second ferromagnetic metal layer 2, a ferromagnetic material, and particularly, a soft magnetic material can be applied. For example, a metal selected from the group consisting of Cr, Mn, Co, Fe and Ni, an alloy containing at least one of these metals, and an alloy containing these metals and at least one element from B, C, and N can be used. Specifically, Co—Fe, Co—Fe—B, and Ni—Fe may be exemplified.

A magnetization direction of the second ferromagnetic metal layer 2 is the z direction (perpendicular to a lamination surface). When the magnetization direction of the second ferromagnetic metal layer 2 is the z direction, it is possible to reduce the size of the magnetoresistance effect element 10. The magnetization direction of the second ferromagnetic metal layer 2 is influenced by a crystal structure of the second ferromagnetic metal layer 2 and the thickness of the second ferromagnetic metal layer 2. The thickness of the second ferromagnetic metal layer 2 is preferably 2.5 nm or less. Since the effect of perpendicular magnetic anisotropy is reduced when the film thickness of the second ferromagnetic metal layer 2 increases, it is preferable that the second ferromagnetic metal layer 2 have a thin film thickness.

A known material can be used for the nonmagnetic layer 3.

For example, when the nonmagnetic layer 3 is made of an insulator (when it is a tunnel barrier layer), $Al_2O_3$, $SiO_2$, MgO, $MgAl_2O_4$, and the like can be used as its material. In addition to these materials, materials in which some of Al, Si, and Mg are replaced with Zn, Be, and the like can be used. Among them, since MgO and $MgAl_2O_4$ are materials that can realize coherent tunneling, spins can be injected efficiently.

When the nonmagnetic layer 3 is made of a metal, Cu, Au, Ag, and the like can be used as the material.

The magnetoresistance effect element 10 may have other layers. For example, an underlayer may be provided on the surface opposite to the nonmagnetic layer 3 of the second ferromagnetic metal layer 2, and a cap layer may be provided on the surface opposite to the nonmagnetic layer 3 of the first ferromagnetic metal layer 1.

It is preferable that a layer disposed between the spin-orbit torque wiring 20 and the magnetoresistance effect element 10 not dissipate the spin propagated from the spin-orbit torque wiring 20. For example, it is known that silver, copper, magnesium, aluminum and the like have long spin diffusion lengths of 100 nm or more and are unlikely to dissipate the spin.

In addition, the thickness of the layer is preferably equal to or smaller than a spin diffusion length of a substance forming the layer. When the thickness of the layer is equal to or smaller than the spin diffusion length, the spin propagated from the spin-orbit torque wiring 20 can be sufficiently transmitted to the magnetoresistance effect element 10.

<Spin-Orbit Torque Wiring>

The spin-orbit torque wiring 20 extends in the x direction. The spin-orbit torque wiring 20 is positioned on one surface of the second ferromagnetic metal layer 2 in the z direction. The spin-orbit torque wiring 20 may be directly connected to the second ferromagnetic metal layer 2 or may be connected thereto with another layer therebetween.

The spin-orbit torque wiring 20 is made of a material in which a pure spin current is generated due to a spin Hall effect when a current flows. As such a material, a material having a configuration in which a pure spin current is generated in the spin-orbit torque wiring 20 is sufficient. Therefore, the spin-orbit torque wiring 20 is not limited to a material including a single element, and it may include a part made of a material in which a pure spin current is generated and a part made of a material in which no pure spin current is generated.

The spin Hall effect is a phenomenon in which, when a current flows through a material, a pure spin current is induced in a direction orthogonal to a direction of the current based on a spin-orbit interaction.

Figure 2:
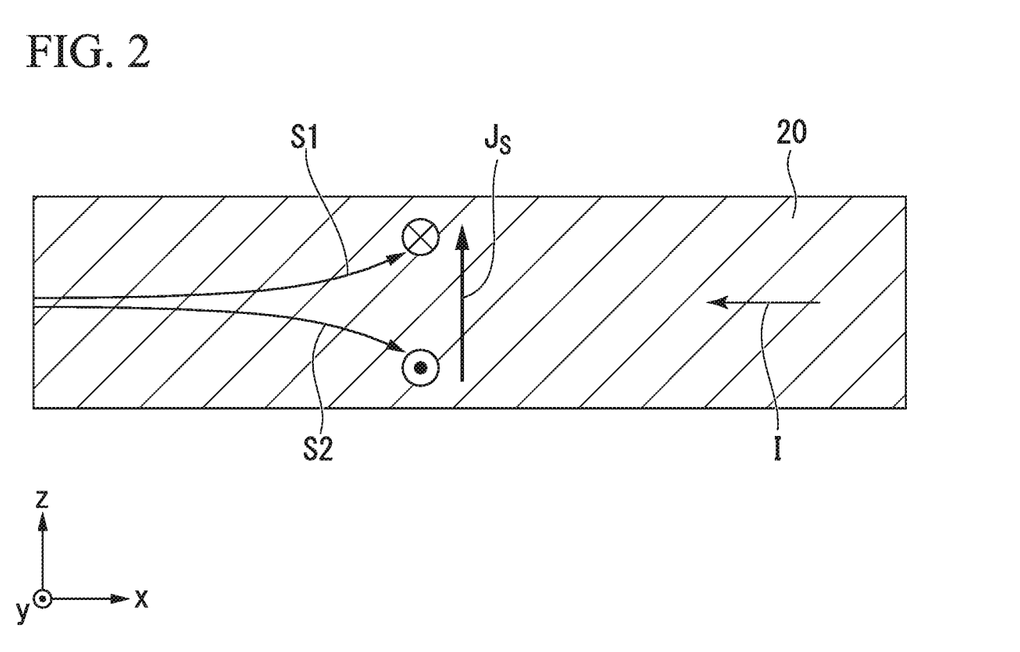
FIG. 2 is a schematic diagram for explaining a spin Hall effect.

FIG. 2 is a schematic diagram for explaining the spin Hall effect. FIG. 2 is a cross-sectional view of the spin-orbit torque wiring 20 shown in FIG. 1 cut in the x direction. A mechanism in which a pure spin current is generated due to the spin Hall effect will be described with reference to FIG. 2.

As shown in FIG. 2, when a current I flows in an extending direction of the spin-orbit torque wiring 20, a first spin S1 directed to the side to the rear of the plane of the paper and a second spin S2 directed to the side in front of the plane of the paper are bent in directions orthogonal to the current. The general Hall effect and the spin Hall effect are the same in that mobile (moving) electric charges (electrons) are bent in the direction of motion (movement). However, the general Hall effect and the spin Hall effect are greatly different in that charged particles that move in a magnetic field receive a Lorentz force and are bent in a movement direction in the general Hall effect, but a movement direction is bent only by movement of electrons (only when a current flows) without there being a magnetic field in the spin Hall effect.

Since the number of electrons with the first spin S1 and the number of electrons with the second spin S2 are the same in a nonmagnetic material (a material that is not a ferromagnetic material), the number of electrons with the first spin S1 upward and the number of electrons with the second spin S2 downward in the drawing are the same. Therefore, a current of a net flow of electric charges becomes zero. A spin current that occurs without this current is specifically called a pure spin current.

There is a common point that, when a current flows through a ferromagnetic material, the first spin S1 and the second spin S2 are bent in directions opposite to each other. On the other hand, there is a difference that, in the ferromagnetic material, one of the first spin S1 and the second spin S2 outnumbers the other, and as a result, a net flow of electric charges occurs (a voltage is generated). Thus, a material composed of only a ferromagnetic material is not included as the material of the spin-orbit torque wiring 20.

Here, when a flow of electrons with the first spin S1 is denoted as $J_\uparrow$, a flow of electrons with the second spin S2 is denoted as $J_\uparrow$, and a spin current is denoted as $J_S$, $J_S = J_\downarrow - J_\uparrow$ is defined. In FIG. 2, $J_S$ as a pure spin current flows upward in the drawing. Here, $J_S$ is a flow of electrons with a polarization of 100%.

In FIG. 1, when a ferromagnetic material is brought into contact with the upper surface of the spin-orbit torque wiring 20, a pure spin current diffuses and flows through the ferromagnetic material. That is, spins are injected into the magnetoresistance effect element 10.

The spin-orbit torque wiring 20 may contain a nonmagnetic heavy metal. Here, a heavy metal refers to a metal having a specific gravity that is equal to or higher than that of yttrium. The spin-orbit torque wiring 20 may be made of only a nonmagnetic heavy metal.

The nonmagnetic heavy metal is preferably a nonmagnetic metal including d electrons or f electrons in the outermost shell and having a large atomic number of 39 or more. This is because such a nonmagnetic metal has a strong spin-orbit interaction causing the spin Hall effect. The spin-orbit torque wiring 20 may be made of only a nonmagnetic metal including d electrons or f electrons in the outermost shell and having a large atomic number of 39 or more.

When a current flows in a metal, all the electrons move in a direction opposite to the current irrespective of the direction of the spin. However, since a nonmagnetic metal including d electrons or f electrons in the outermost shell and having a large atomic number has a strong spin-orbit interaction, a direction of movement of electrons depends on a direction of the spin of the electrons due to the spin Hall effect, and a pure spin current $J_s$ is likely to be generated.

The spin-orbit torque wiring 20 may contain a magnetic metal. The magnetic metal refers to a ferromagnetic metal or an antiferromagnetic metal. This is because, when a small amount of magnetic metal is contained in the nonmagnetic metal, the spin-orbit interaction is enhanced, and the spin current generation efficiency for a current that flows through the spin-orbit torque wiring 20 can increase. The spin-orbit torque wiring 20 may be made of only an antiferromagnetic metal.

Since the spin-orbit interaction is caused by an internal field unique to a substance of a spin-orbit torque wiring material, a pure spin current is also generated in the nonmagnetic material. When a small amount of a magnetic metal is added to the spin-orbit torque wiring material, the spin current generation efficiency is improved because the magnetic metal itself dissipates flowing electron spins. However, when an amount of a magnetic metal added is too large, since a generated pure spin current is dissipated by the added magnetic metal, as a result, a spin current is unlikely to be generated efficiently. Therefore, preferably, a molar ratio of the added magnetic metal is sufficiently smaller than a molar ratio of a main component of a pure spin generating part in the spin-orbit torque wiring. As an example, the molar ratio of the added magnetic metal is preferably 3% or less.

The spin-orbit torque wiring 20 may contain a topological insulator. The spin-orbit torque wiring 20 may be made of only a topological insulator. A topological insulator is a substance which includes an insulator or a high resistance component therein and has a surface in a spin-polarized metallic state. There is an internal magnetic field called a spin-orbit interaction in the substance. Thus, even if there is no external magnetic field, a new topological phase is exhibited due to an effect of the spin-orbit interaction. This is a topological insulator, and a pure spin current can be generated with high efficiency due to a strong spin orbit interaction and breaking of inversion symmetry at the edge.

As the topological insulator, for example, SnTe, $Bi_{1.5}Sb_{0.5}Te_{1.7}Se_{1.3}$, $TlBiSe_2$, $Bi_2Te_3$, and $(Bi_{1-x}Sb_x)_2Te_3$ are preferable. Such topological insulators can generate a spin current with high efficiency.

The spin current magnetoresistance effect element 100 may contain components other than the magnetoresistance effect element 10 and the spin-orbit torque wiring 20. For example, it may have a substrate as a support. A substrate having excellent flatness is preferable, and, for example, Si or AlTiC can be used as its material.

<Electrode>

The electrode 40 is provided at a point at which a current flowing through the magnetoresistance effect element 10 and the spin-orbit torque wiring 20 is connected. The spin current magnetoresistance effect element 100 shown in FIG. 1 includes a first electrode 41 connected to the first ferromagnetic metal layer 1 of the magnetoresistance effect element 10, a second electrode 42 connected to a first point 21 of the spin-orbit torque wiring 20, and a third electrode 43 connected to a second point 22 of the spin-orbit torque wiring 20. The electrode 40 is not particularly limited as long as it has excellent conductivity.

<Element Selection Unit>

The element selection unit 50 includes a first transistor 51, a second transistor 52, and a third transistor 53. Those known can be used as the first transistor 51, the second transistor 52, and the third transistor 53.

The first transistor 51 is electrically connected to a third point 11 on the side of the first ferromagnetic metal layer 1 of the magnetoresistance effect element 10. In FIG. 1, the first transistor 51 is connected through the first electrode 41 laminated in the z direction of the first ferromagnetic metal layer 1. The first transistor 51 can be provided outside the element.

The second transistor 52 is electrically connected via the first point 21 of the spin-orbit torque wiring 20. In FIG. 1, the second transistor 52 is connected via the second electrode 42 connected to the first point 21 of the spin-orbit torque wiring 20. Here, the first point 21 of the spin-orbit torque wiring 20 may be a part not overlapping the magnetoresistance effect element 10 when viewed in the z direction of the spin-orbit torque wiring 20.

The third transistor 53 is electrically connected to the second point 22 of the spin-orbit torque wiring 20. In FIG. 1, the third transistor 53 is connected via the third electrode 43 connected to the second point 22 of the spin-orbit torque wiring 20. Here, the second point 22 of the spin-orbit torque wiring 20 is provided at a position between the first point 21 and the magnetoresistance effect element 10 in the x direction of the spin-orbit torque wiring 20 when viewed in the z direction. When the magnetoresistance effect element 10 is interposed between the first point 21 and the second point 22 in the x direction, positions of the first point 21 and the second point 22 may be shifted in the y direction.

<Control Unit>

The control unit 30 controls a direction of a read current that flows through the magnetoresistance effect element 10 and the spin-orbit torque wiring 20 during reading. The control unit 30 is connected to at least one of the first point 21 and the second point 22 which are positions with the magnetoresistance effect element 10 interposed therebetween in the first direction in the spin-orbit torque wiring 20, and the third point 11 on the side of a first ferromagnetic layer 1 of the magnetoresistance effect element 10. The control unit 30 shown in FIG. 1 is a switching element electrically connected to the first point 21 of the spin-orbit torque wiring 20. The control unit 30 shown in FIG. 1 controls a potential of the first point 21. The control unit 30 is not limited to a switching element as long as it can change a potential between the first point 21 and the second point 22 of the spin-orbit torque wiring 20, and a known element can be used. In addition, while the control unit 30 is electrically connected to the first point 21 in FIG. 1, it may be electrically connected to the second point 22.

When there are a plurality of spin current magnetoresistance effect elements 100, they can share the control unit 30. The control unit 30 is used to set a potential of the second electrode 42 during writing to be higher than a potential of the third electrode 43, and is connected to a reference potential during reading. In FIG. 1, the reference potential is set as a ground G.

(Operation of Spin Current Magnetoresistance Effect Element)

Figure 3:
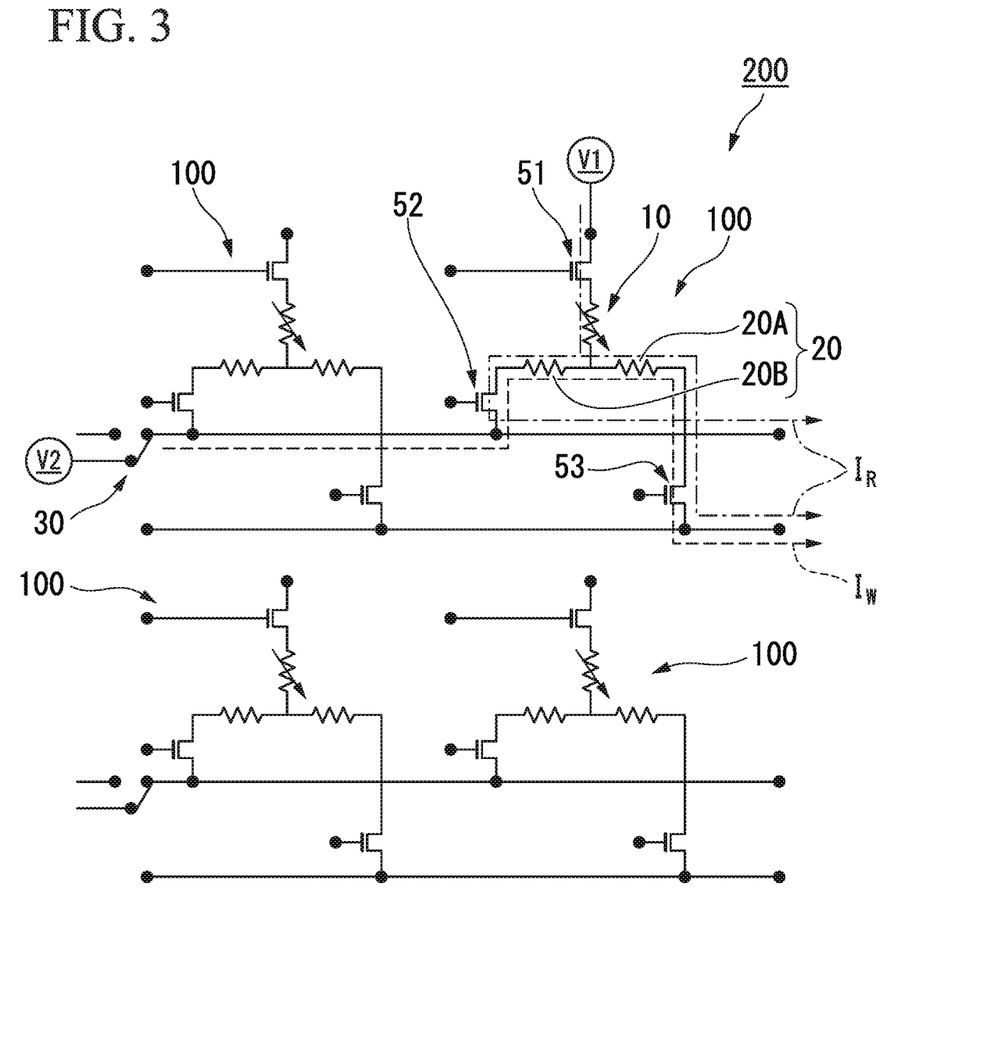
FIG. 3 is a circuit diagram of a magnetic memory in which the plurality of spin current magnetoresistance effect elements according to the first embodiment are disposed.

FIG. 3 is a circuit diagram of a magnetic memory in which the plurality of spin current magnetoresistance effect elements 100 are disposed. A magnetic memory 200 shown in FIG. 3 includes the plurality of spin current magnetoresistance effect elements 100. In the magnetic memory 200, the plurality of spin current magnetoresistance effect elements 100 share the control unit 30. While one control unit 30 is provided for each of two elements in FIG. 3, one control unit 30 may be provided for each element, and one control unit 30 may be shared among all elements. In addition, while the first transistor 51 is provided for each element in FIG. 3, the first transistor 51 may be shared among a plurality of elements. In FIG. 3, the spin-orbit torque wiring 20 is shown as resistors 20A and 20B. A write operation and a read operation of the spin current magnetoresistance effect element 100 will be described below with reference to FIG. 1 and FIG. 3.

"Write operation"

Writing of data in the spin current magnetoresistance effect element 100 is performed by controlling a relative angle between the magnetization M2 of the second ferromagnetic metal layer 2 and the magnetization M1 of the first ferromagnetic metal layer 1. This relative angle between the magnetizations M1 and M2 is controlled by a direction of the magnetization M2 of the second ferromagnetic metal layer. A direction of the magnetization M2 of the second ferromagnetic metal layer 2 is reversed by a spin-orbit torque (SOT) induced due to a pure spin current generated by a spin-orbit interaction or the Rashba effect at an interface between different types of materials.

When data is written in a specific spin current magnetoresistance effect element 100 of the magnetic memory 200, the switching element (the control unit 30) is switched, and the second electrode 42 (refer to FIG. 1) is connected to a potential V2. Then, the spin current magnetoresistance effect element 100 in which data is written is selected and the second transistor 52 and the third transistor 53 of the selected spin current magnetoresistance effect element 100 are opened.

In the second electrode 42 in the selected spin current magnetoresistance effect element 100, a potential becomes the same level as the potential V2 and becomes higher than a potential of the third electrode 43 connected to the ground G (refer to FIG. 1). As a result, a write current $I_W$ flows in a direction from the second electrode 42 to the third electrode 43 of the spin-orbit torque wiring 20. This current generates a pure spin current. Thus, a spin directed in a predetermined direction is injected from the spin-orbit torque wiring 20 to the second ferromagnetic metal layer 2 due to the pure spin current. The injected spin imparts a spin-orbit torque to the magnetization M2 of the second ferromagnetic metal layer 2, and the magnetization M2 of the second ferromagnetic metal layer 2 is magnetically reversed and data is written.

"Read Operation"

The spin current magnetoresistance effect element 100 reads a resistance value of the magnetoresistance effect element 10 which is changed by a relative angle between the magnetization M2 of the second ferromagnetic metal layer 2 and the magnetization M1 of the first ferromagnetic metal layer 1 as data.

During a read operation of the spin current magnetoresistance effect element 100, the switching element (the control unit 30) is switched, and the second electrode 42 is connected to the ground G. Then, the first transistor 51, the second transistor 52, and the third transistor 53 are opened. When the second electrode 42 is connected to the ground G, the second electrode 42 and the third electrode 43 have the same potential. The first electrode 41 connected to a potential V1 has a higher potential than the second electrode 42 and the third electrode 43. Therefore, a read current $I_R$ flows from the first electrode 41 in a lamination direction of the magnetoresistance effect element 10, is shunted at the spin-orbit torque wiring 20, and then flows to the second electrode 42 and the third electrode 43. When the read current $I_R$ is output to the outside, data is read. In the spin current magnetoresistance effect element 100, when the read current $I_R$ is shunted midway, it is possible to reduce erroneous writing during reading.

Figure 4:
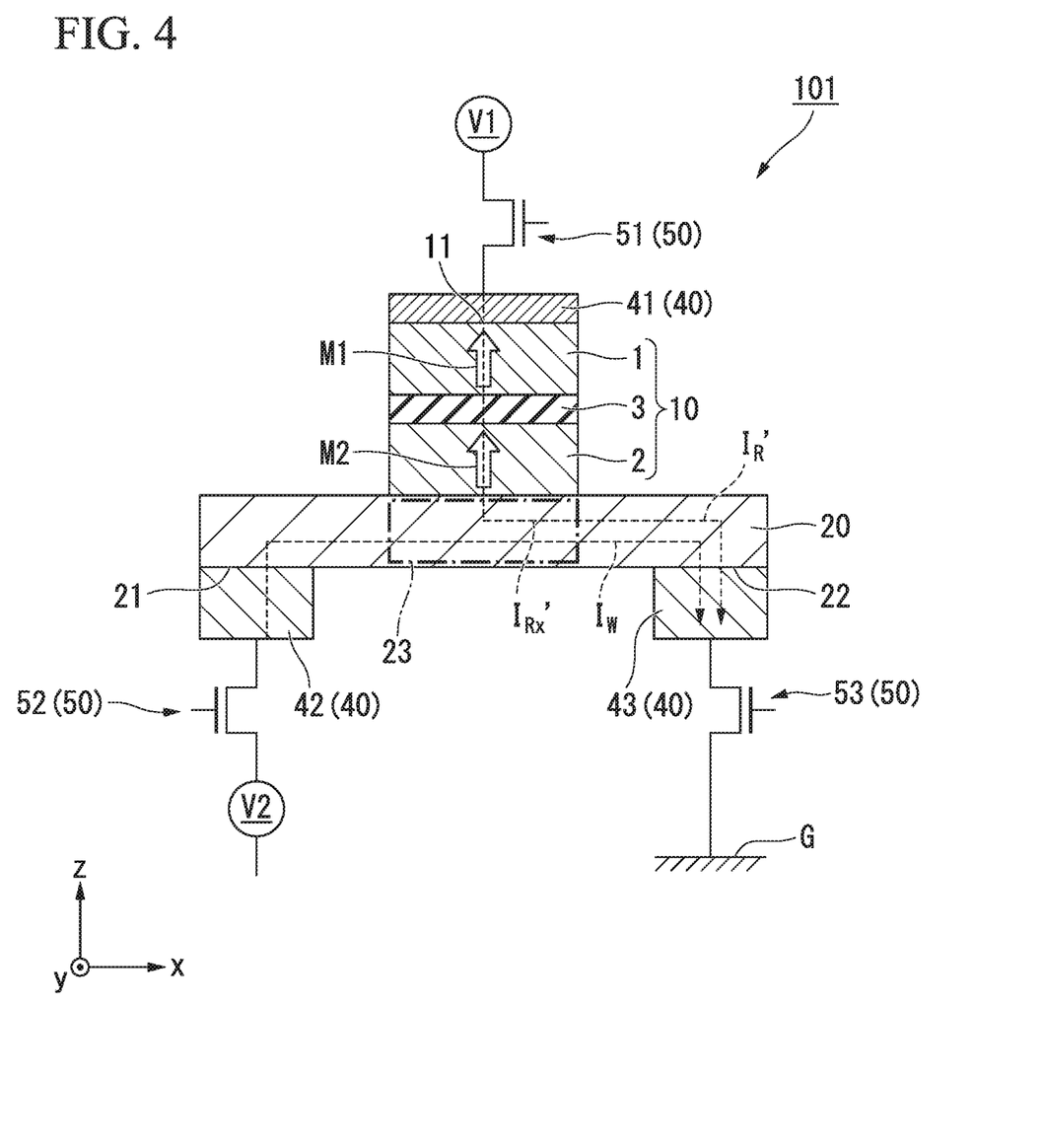
FIG. 4 is a cross-sectional view of a spin current magnetoresistance effect element in which a read current does not shunt at a spin-orbit torque wiring and flows toward one electrode.

FIG. 4 is a cross-sectional view of a spin current magnetoresistance effect element 101 in which a read current does not shunt at a spin-orbit torque wiring and flows toward one electrode. The spin current magnetoresistance effect element 101 shown in FIG. 4 is different from the spin current magnetoresistance effect element 100 according to the first embodiment in that it does not include the control unit 30. The other components are the same as those of from the spin current magnetoresistance effect element 100 and denoted with the same reference numerals.

Figure 5:
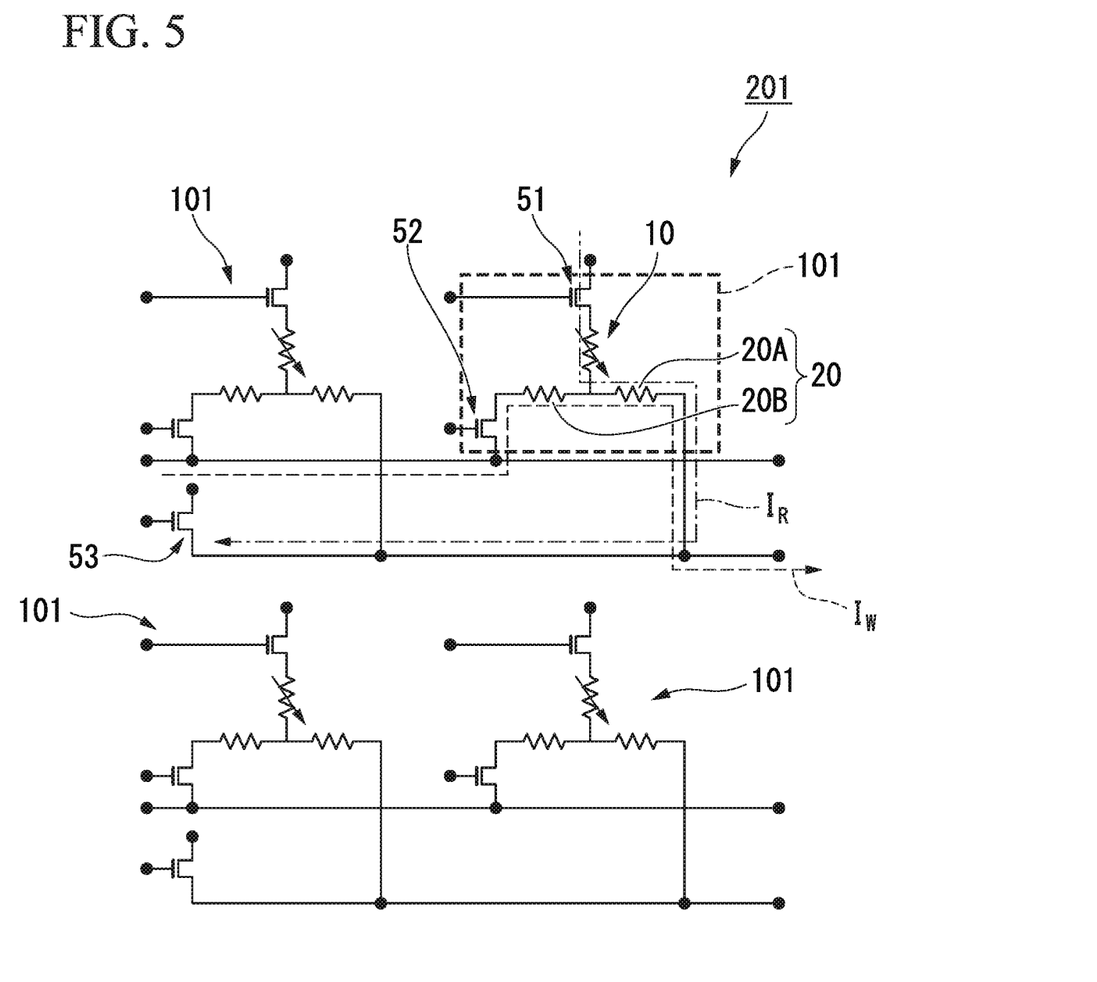
FIG. 5 is a circuit diagram of a magnetic memory in which a plurality of spin current magnetoresistance effect elements including no control unit are disposed.

In addition, FIG. 5 is a circuit diagram of a magnetic memory in which the plurality of spin current magnetoresistance effect elements 101 including no control unit 30 are disposed. In the magnetic memory 200 shown in FIG. 3, each of the spin current magnetoresistance effect elements 100 includes three transistors (the first transistor 51, the second transistor 52, and the third transistor 53). A magnetic memory 201 shown in FIG. 5 is different from the magnetic memory 200 in that each of the spin current magnetoresistance effect elements 101 includes two transistors (the first transistor 51, and the second transistor 52), and one transistor (the third transistor 53) is shared among the plurality of spin current magnetoresistance effect elements 101.

When data is written in a specific spin current magnetoresistance effect element 101 of the magnetic memory 201 shown in FIG. 5, the second transistor 52 and the third transistor 53 are opened. When two transistors are opened, a write current $I_W$ flows from the second electrode 42 toward the third electrode 43. A direction of the magnetization M2 of the second ferromagnetic metal layer 2 is controlled by the write current $I_W$, and data is written. A flow of the write current $I_W$ equals to that of the spin current magnetoresistance effect element 100 shown in FIG. 1.

On the other hand, when data is read from a specific spin current magnetoresistance effect element 101 of the magnetic memory 201 shown in FIG. 5, the first transistor 51 and the third transistor 53 are opened. When two transistors are opened, a read current $I_R'$ flows from the first electrode 41 toward the third electrode 43.

As shown in FIG. 4, in an overlapping unit 23 overlapping the magnetoresistance effect element 10 when viewed in the z direction of the spin-orbit torque wiring 20, the read current $I_R'$ has a component that flows through the spin-orbit torque wiring 20 in the x direction (hereinafter, this current will be referred to as an x component $I_{Rx}'$).

Like the write current $I_W$, the x component $I_{Rx}'$ generates a pure spin current, and injects a spin into the second ferromagnetic metal layer 2. The injected spin imparts an SOT to the magnetization M2 of the second ferromagnetic metal layer 2. A current density of the x component $I_{Rx}'$ is sufficiently smaller than a current density of the write current $I_W$. Therefore, reversal of the magnetization M2 of the second ferromagnetic metal layer 2 due to the spin-orbit torque induced by the x component $I_{Rx}'$ is not generated in principle. However, when an external factor such as thermal fluctuation is added, the spin-orbit torque induced by the x component $I_{Rx}'$ causes erroneous writing.

On the other hand, in the spin current magnetoresistance effect element 100 according to the first embodiment, the read current $I_R$ is shunted at the spin-orbit torque wiring 20 (refer to FIG. 1). Therefore, in the overlapping unit 23, the read current $I_R$ has a component that flows through the spin-orbit torque wiring 20 in the x direction (hereinafter, this current will be referred to as an x component $I_{Rx}$) and a component that flows in the -x direction (hereinafter this current will be referred to as an -x component $I_{R-x}$).

In the spin current magnetoresistance effect element 100, the read current $I_R$ is shunted. Therefore, current magnitudes of the x component $I_{Rx}$ and the -x component $I_{R-x}$ are smaller than that of the x component $I_{Rx}'$ shown in FIG. 4. An SOT that can be induced from the x component $I_{Rx}$ and the -x component $I_{R-x}$ is small, and erroneous writing is reduced.

In addition, directions in which the x component $I_{Rx}$ and the -x component $I_{R-x}$ flow are opposite to each other. Therefore, a direction in which the x component $I_{Rx}$ injects a spin into the second ferromagnetic metal layer 2 and a direction in which the -x component $I_{R-x}$ injects a spin into the second ferromagnetic metal layer 2 are opposite to each other, and vectors of a spin-orbit torque imparted to the magnetization M2 of the second ferromagnetic metal layer 2 are in directions opposite to each other. Accordingly, forces imparted to the magnetization M2 by the x component $I_{Rx}$ and the -x component $I_{R-x}$ are cancelled out and erroneous writing is further reduced.

In order to completely cancel out forces imparted to the magnetization M2 by the x component $I_{Rx}$ and the -x component $I_{R-x}$, the first point 21 and the second point 22 of the spin-orbit torque wiring 20 are preferably provided at positions symmetrical with respect to the magnetoresistance effect element 10. In addition, when the material, thickness, width and the like of the spin-orbit torque wiring 20 differ depending on the position in the x direction, it is preferable that a resistance value between the magnetoresistance effect element 10 and the first point 21 be equal to a resistance value between the magnetoresistance effect element 10 and the second point 22.

As described above, according to the spin current magnetoresistance effect element 100 of the first embodiment, it is possible to reduce erroneous writing during reading with the read current $I_R$. In addition, when magnitudes of read currents shunted at the spin-orbit torque wiring 20 in the x direction and the -x direction are set to be the same, it is possible to further reduce erroneous writing.

In addition, the effect of reducing erroneous writing during reading of the spin current magnetoresistance effect element 100 according to the first embodiment is particularly beneficial when the read current $I_R$ satisfying the following Relational Expression (1) is applied during reading.

$$Jc \times S_{SOT} < I_R < Jc \times S_{MTJ} \tag{1}$$

In the above Relational Expression (1), Jc is a threshold inversion current density required for magnetization reversal, $S_{SOT}$ is a cross-sectional area of the spin-orbit torque wiring 20 cut in the yz plane orthogonal to the x direction, and $S_{MTJ}$ is a cross-sectional area of the magnetoresistance effect element 10 cut in the xy plane orthogonal to the z direction.

Whether the magnetization M2 of the second ferromagnetic metal layer 2 of the magnetoresistance effect element 10 is magnetically reversed is determined by a current density of a flowing current. A current density required for magnetically reversing the magnetization M2 is called a threshold inversion current density. A threshold inversion current density required for magnetization reversal by the SOT and a threshold inversion current density required for magnetization reversal by the STT are thought to be almost the same.

In the spin current magnetoresistance effect element 101 shown in FIG. 4, in order to prevent erroneous writing, it is necessary to consider the effect of the STT by the read current $I_R'$ that flows in the z direction and the effect of the SOT by the x component $I_{Rx}'$ of the read current $I_R'$. When the read current $I_R'$ is not shunted, a current magnitude of the x component $I_{Rx}'$ and a current magnitude of the read current $I_R'$ are the same. Therefore, the read current $I_R'$ needs to satisfy the following Relational Expression (2).

$$I_R' < Jc \times S_{SOT} < Jc \times S_{MTJ} \tag{2}$$

On the other hand, in the spin current magnetoresistance effect element 100 shown in FIG. 1, since the read current $I_R$ is shunted midway, a current magnitude of the x component $I_{Rx}$ is smaller than a current magnitude of the read current $I_R$. Therefore, when the following Relational Expression (3) is satisfied, it is possible to reduce erroneous writing due to the effect of the SOT by the x component $I_{Rx}$ of the read current $I_R$.

$$I_{Rx} < Jc \times S_{SOT} \tag{3}$$

That is, according to the spin current magnetoresistance effect element 100 of the first embodiment, the read current $I_R$ itself can be made larger than $Jc \times S_{SOT}$. When the read current $I_R$ is larger, a signal to be output can increase. That is, it is possible to prevent data from becoming noise and prevent the occurrence of erroneous reading. In order to satisfy the relationship of General Formula (1), a cross-sectional area $S_{SOT}$ of the spin-orbit torque wiring 20 cut in the yz plane orthogonal to the x direction is preferably equal to or smaller than a cross-sectional area $S_{MTJ}$ of the magnetoresistance effect element 10 cut in the xy plane orthogonal to the z direction.

While preferable embodiments of the present invention have been described in detail above, the present invention is not limited to the specific embodiments, and various modifications can be made within the spirit and scope of the present invention described in the scope of the appended claims.

Figure 6:
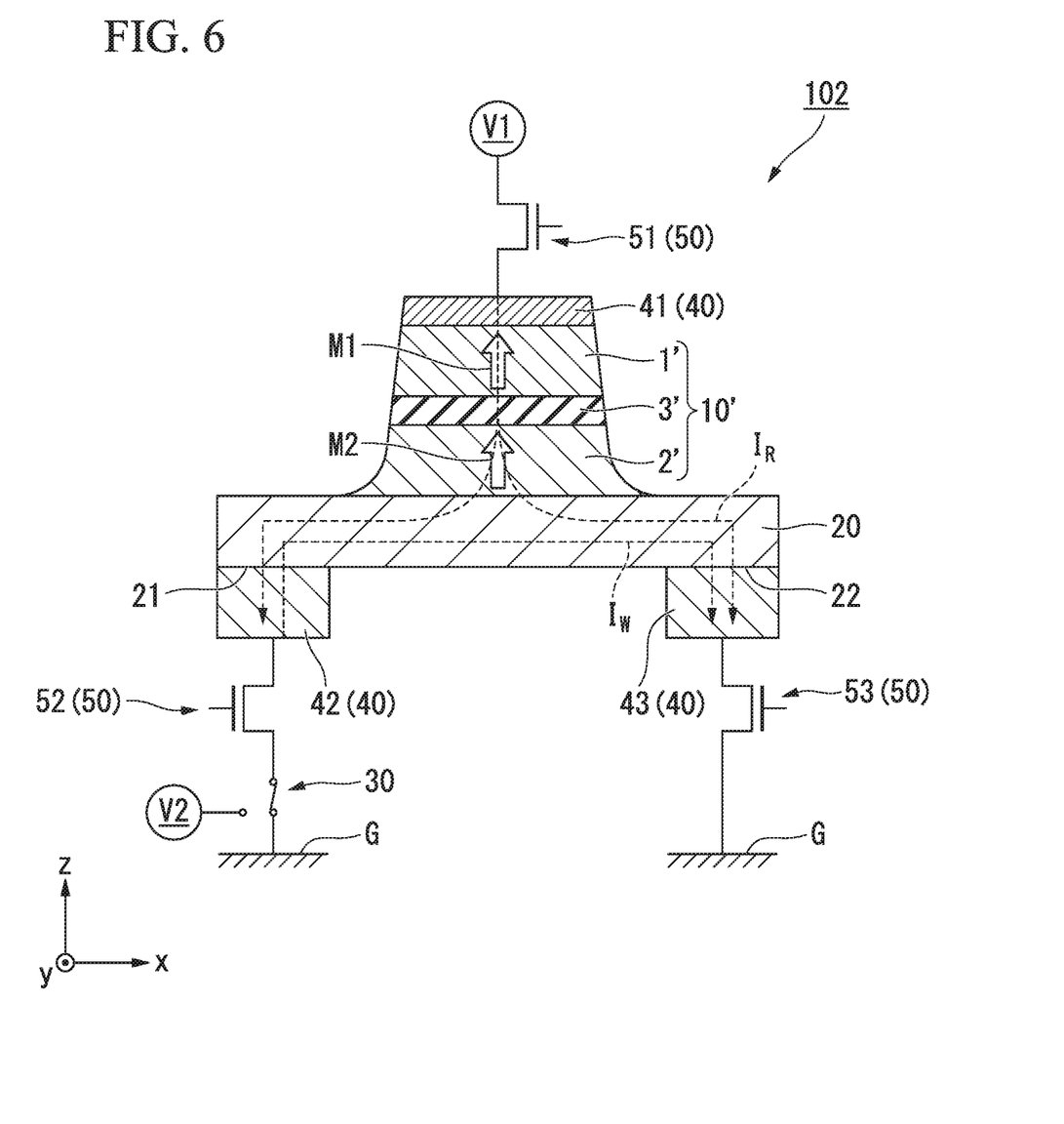
FIG. 6 is a schematic cross-sectional view of another example of the spin current magnetoresistance effect element according to the first embodiment.

For example, as shown in FIG. 6, the shape of the magnetoresistance effect element 10 may not be constant in the z direction. FIG. 6 is a schematic cross-sectional view of another example of the spin current magnetoresistance effect element according to the first embodiment. In a magnetoresistance effect element 10' of a spin current magnetoresistance effect element 102 shown in FIG. 6, an area of a first surface on the side of the spin-orbit torque wiring 20 of the second ferromagnetic metal layer 2' is larger than an area of a second surface of the second ferromagnetic metal layer on the side of the nonmagnetic layer 3'.

In the spin current magnetoresistance effect element 102 shown in FIG. 6, the read current $I_R$ flows along the shape of the magnetoresistance effect element 10'. Therefore, it is possible to prevent the read current $I_R$ from generating a flow of a current along the spin-orbit torque wiring 20 which causes generation of a spin-orbit torque. As a result, the spin current magnetoresistance effect element 102 can further reduce erroneous writing.

In addition, in the spin current magnetoresistance effect elements 100 and 101, a rectifier electrically connected to the first ferromagnetic metal layers 1 and 1' may be further included. When the rectifier is provided, it is possible to prevent the write current $I_W$ from flowing in the lamination direction of the magnetoresistance effect element 10.

In addition, the spin current magnetoresistance effect element 100 shown in FIG. 1 is controlled by the control unit 30 so that the second electrode 42 (the first point 21) and the third electrode 43 (the second point 22) during reading have the same potential. The second electrode 42 (the first point 21) and the third electrode 43 (the second point 22) need not necessarily have the same potential as long as a read current is shunted and flows. A potential difference between the first electrode 41 (the third point 11) and the second electrode 42 (the first point 21) is preferably within 50% of a potential difference between the first electrode 41 (the third point 11) and the third electrode 43 (the second point 22).

In addition, in the spin current magnetoresistance effect element 100 shown in FIG. 1, the first point 21 and the second point 22 are provided at positions symmetrical with respect to the magnetoresistance effect element 10. Regarding a positional relationship, the first point 21 and the second point may be provided at positions asymmetrical with respect to the magnetoresistance effect element 10. For example, when a large magnitude of the read current $I_R$ flows toward the first point 21 after being shunted, a distance between the first point 21 and the magnetoresistance effect element 10 is preferably shorter than a distance between the second point 22 and the magnetoresistance effect element 10. On the side in which a large amount of the read current $I_R$ flows, when a distance by which the read current $I_R$ flows is reduced, it is possible to reduce parasitic resistance due to the spin-orbit torque wiring 20. In addition, a resistance value between the magnetoresistance effect element 10 and the first point 21 is preferably 50% or more and 150% or less of a resistance value between the magnetoresistance effect element 10 and the second point 22, and is more preferably the same as a resistance value between the magnetoresistance effect element 10 and the second point 22.

Figure 7:
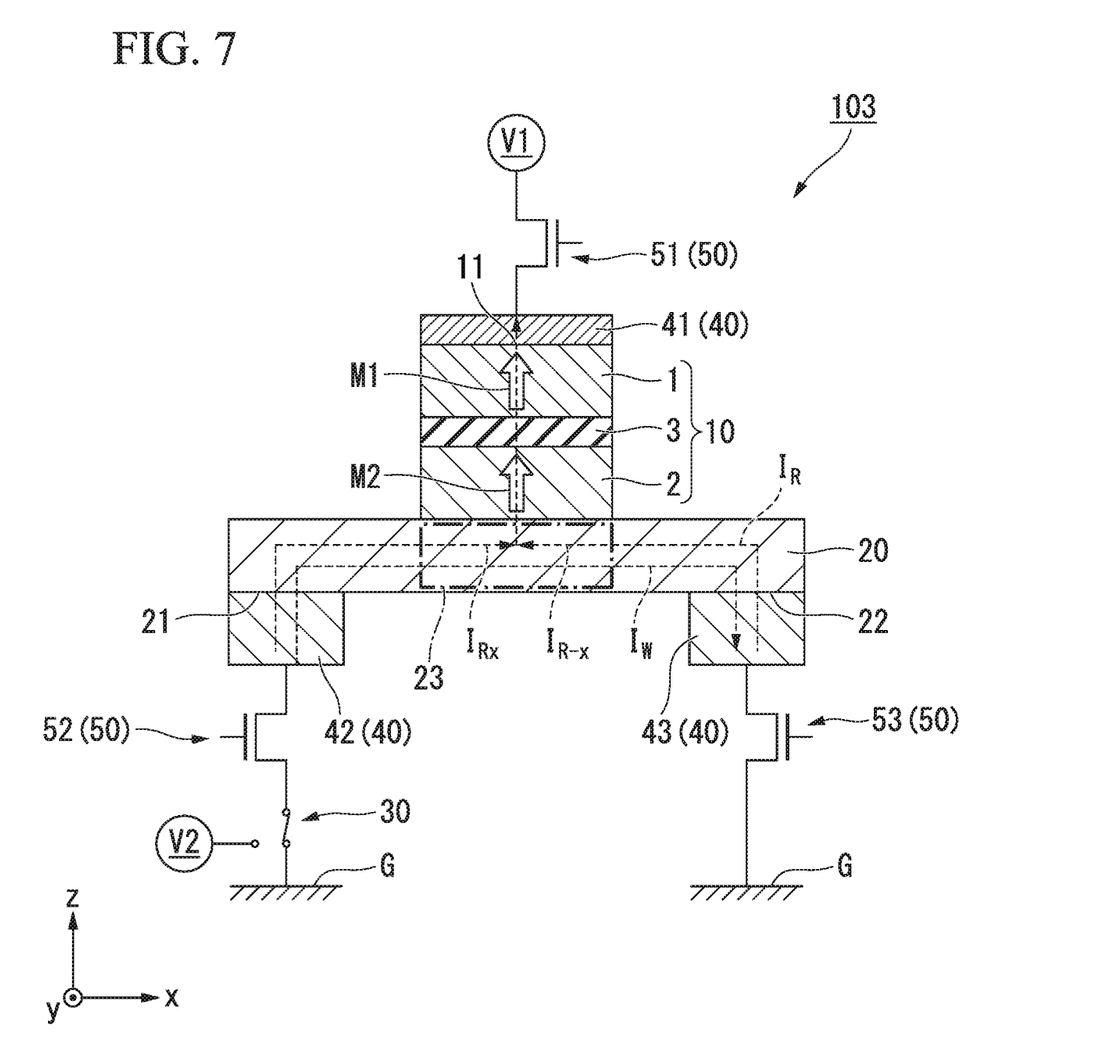
FIG. 7 is a schematic cross-sectional view of another example of the spin current magnetoresistance effect element according to the first embodiment.

In addition, as in a spin current the magnetoresistance effect element 103 shown in FIG. 7, the potential V1 of the third point 11 may be lower than the ground G, and a flow direction of the read current $I_R$ may be reversed. The control unit 30 in the spin current the magnetoresistance effect element 103 shown in FIG. 7 is configured to set potentials of the first point 21 and the second point 22 during reading to be higher than a potential of the third point 11.

In this case, the read current $I_R$ is merged toward the third point 11 from the first point 21 and the second point 22. Even if the read current $I_R$ is merged, the current magnitudes of the x component $I_{Rx}$ and the −x component $I_{R-x}$ are smaller than the x component $I_{Rx}'$ shown in FIG. 4. An SOT that can be induced from the x component $I_{Rx}$ and the −x component $I_{R-x}$ is small and erroneous writing is reduced.

In addition, directions in which the x component $I_{Rx}$ and the −x component $I_{R-x}$ flow are opposite to each other. Therefore, a direction in which the x component $I_{Rx}$ injects a spin into the second ferromagnetic metal layer 2 and a direction in which the −x component $I_{R-x}$ injects a spin into the second ferromagnetic metal layer 2 are opposite to each other, and vectors of a spin-orbit torque imparted to the magnetization M2 of the second ferromagnetic metal layer 2 are in directions opposite to each other. Accordingly, forces imparted to the magnetization M2 by the x component $I_{Rx}$ and the −x component $I_{R-x}$ are cancelled out and erroneous writing is further reduced.

REFERENCE SIGNS LIST

1: First ferromagnetic metal layer
2: Second ferromagnetic metal layer
3: Nonmagnetic layer
10: Magnetoresistance effect element
11: Third point
20: Spin-orbit torque wiring
21: First point
22: Second point
23: Overlapping unit
30: Control unit
40: Electrode
41: First electrode
42: Second electrode
43: Third electrode
50: Element selection unit
51: First transistor
52: Second transistor
53: Third transistor
M1, M2: Magnetization
$I_W$: Write current
$I_R$: Read current

The invention claimed is:

1. A spin current magnetoresistance effect element comprising:
a magnetoresistance effect element including a first ferromagnetic metal layer, a second ferromagnetic metal layer, and a nonmagnetic layer interposed between the first ferromagnetic metal layer and the second ferromagnetic metal layer;
a spin-orbit torque wiring that extends in a first direction intersecting a lamination direction of the magnetoresistance effect element and is positioned on a side of the magnetoresistance effect element with the second ferromagnetic metal layer;
a second transistor that is electrically connected to a first point of the spin-orbit torque wiring; and
a third transistor that is electrically connected to a second point of the spin-orbit torque wiring,
wherein
the first point and the second point interpose the magnetoresistance effect element in the first direction,
the spin-orbit torque wiring is between the second transistor and the third transistor, and is connected to one magnetoresistance effect element,
the second transistor and the third transistor are both connected during readout,
a current path distance through which the read current flows between the magnetoresistance effect element and the first point is different from a current path distance through which the read current flows between the magnetoresistance effect element and the second point, and
the spin current magnetoresistance effect element satisfies a Relational Expression (A):

$$I_{Rx} < Jc \times S_{SOT} < I_R \quad (A)$$

where IR is the read current,
$I_{Rx}$ is a current that flows through an overlapping unit in the first direction among the read current, and the overlapping unit is a part of the spin-orbit torque wiring which overlaps with the magnetoresistance effect element in the lamination direction, Jc is a threshold inversion current density required for magnetization reversal, and $S_{SOT}$ is a cross-sectional area of the spin-orbit torque wiring cut in a plane orthogonal to the first direction.

2. The spin current magnetoresistance effect element according to claim 1, wherein the first point and the second point during reading to be higher or lower than a potential of the first ferromagnetic metal layer.

3. The spin current magnetoresistance effect element according to claim 1, wherein a cross-sectional area of the spin-orbit torque wiring cut in a plane orthogonal to the first direction is smaller than a cross-sectional area of the magnetoresistance effect element cut in a plane orthogonal to the lamination direction.

4. The spin current magnetoresistance effect element according to claim 1, wherein an area of a first surface of the second ferromagnetic metal layer on the side with the spin-orbit torque wiring is larger than an area of a second surface of the second ferromagnetic metal layer on the side of the nonmagnetic layer.

5. The spin current magnetoresistance effect element according to claim 1, further comprising:
a rectifier that is electrically connected to the first ferromagnetic metal layer.

6. A magnetic memory comprising:
a plurality of the spin current magnetoresistance effect elements according to claim 1.

7. The spin current magnetoresistance effect element according to claim 1, wherein a resistance value between the magnetoresistance effect element and the first point is 50% or more and 150% or less of a resistance value between the magnetoresistance effect element and the second point.

* * * * *